United States Patent
Jung et al.

(10) Patent No.: US 10,617,008 B2
(45) Date of Patent: Apr. 7, 2020

(54) CAPACITOR AND BOARD HAVING THE SAME

(71) Applicant: SAMSUNG ELECTRO-MECHANICS CO., LTD., Suwon-si, Gyeonggi-do (KR)

(72) Inventors: Jin Man Jung, Suwon-si (KR); Jin Kyung Joo, Suwon-si (KR); Ik Hwan Chang, Suwon-si (KR); Taek Jung Lee, Suwon-si (KR); Won Young Lee, Suwon-si (KR); Yong Won Seo, Suwon-si (KR); Jin Woo Chun, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/108,883

(22) Filed: Aug. 22, 2018

(65) Prior Publication Data

US 2018/0368264 A1    Dec. 20, 2018

Related U.S. Application Data

(63) Continuation of application No. 15/449,147, filed on Mar. 3, 2017, now abandoned.

(30) Foreign Application Priority Data

Jul. 20, 2016  (KR) .................. 10-2016-0092030

(51) Int. Cl.
*H01G 4/012*    (2006.01)
*H01G 4/232*    (2006.01)
(Continued)

(52) U.S. Cl.
CPC ............. *H05K 1/181* (2013.01); *H01G 4/012* (2013.01); *H01G 4/12* (2013.01); *H01G 4/232* (2013.01);
(Continued)

(58) Field of Classification Search
CPC .......... H01G 4/012; H01G 4/236; H01G 4/01; H01G 4/005; H01G 4/232; H01G 4/30; H01G 4/1227; H01G 4/228; H01G 4/12
(Continued)

(56) References Cited

U.S. PATENT DOCUMENTS 5,400,210 A    3/1995  Sugimoto et al.
6,452,781 B1   9/2002  Ahiko et al.
(Continued)

FOREIGN PATENT DOCUMENTS

CN    1747087 A    3/2006
CN    1783376 A    6/2006
(Continued)

OTHER PUBLICATIONS

Taiyo (JP H10-270282) English Translation provided with Office Action (Year: 1998).*
(Continued)

*Primary Examiner* — Roshn K Varghese
(74) *Attorney, Agent, or Firm* — Morgan, Lewis & Bockius LLP (57) ABSTRACT

A capacitor includes a body including a plurality of dielectric layers, first and second internal electrodes alternately disposed with respective dielectric layers interposed therebetween, and first and second insulating regions. The first insulating region is disposed in each of the first internal electrodes and includes a first connection electrode disposed therein. The second insulating region is disposed in each of the second internal electrodes and includes a second con-
(Continued)

nection electrode disposed therein. The products $D1 \times Td$ and $D2 \times Td$ are greater than 20 µm², where Td is a thickness of the dielectric layer, and D1 and D2 are widths of the first and second insulating regions, respectively.

19 Claims, 10 Drawing Sheets

(51) Int. Cl.
    *H01G 4/30* (2006.01)
    *H01G 4/12* (2006.01)
    *H05K 1/18* (2006.01)
    *H05K 3/34* (2006.01)
    *H05K 1/11* (2006.01)

(52) U.S. Cl.
    CPC ............... *H01G 4/30* (2013.01); *H05K 1/111* (2013.01); *H05K 3/3431* (2013.01); *H01G 4/1227* (2013.01); *H05K 2201/10015* (2013.01); *Y02P 70/611* (2015.11); *Y02P 70/613* (2015.11)

(58) Field of Classification Search
    USPC .................................. 361/307, 308.1, 306.1
    See application file for complete search history.

(56) References Cited

U.S. PATENT DOCUMENTS

| | | | |
|---|---|---|---|
| 7,292,430 | B2 | 11/2007 | Lee et al. |
| 8,564,931 | B2 | 10/2013 | Nishisaka et al. |
| 2002/0041006 | A1 | 4/2002 | Ahiko et al. |
| 2004/0125539 | A1 | 7/2004 | Murakami et al. |
| 2006/0049131 | A1 | 3/2006 | Satou |
| 2006/0120018 | A1 | 6/2006 | Lee et al. |
| 2006/0198079 | A1 | 9/2006 | Shim et al. |
| 2007/0030628 | A1 | 2/2007 | Yamamoto et al. |
| 2011/0290542 | A1 | 12/2011 | Nishisaka et al. |
| 2014/0345926 | A1* | 11/2014 | Lee .......................... H01G 4/30 174/260 |
| 2014/0368091 | A1 | 12/2014 | Kim et al. |
| 2015/0380167 | A1 | 12/2015 | Lim et al. |

FOREIGN PATENT DOCUMENTS

| | | | |
|---|---|---|---|
| CN | 102290235 A | | 12/2011 |
| JP | H10-270282 | * | 10/1998 |
| JP | H10-270282 A | | 10/1998 |
| JP | 2006-222441 A | | 8/2006 |
| JP | 2007-173651 A | | 7/2007 |
| KR | 10-2002-0066135 A | | 8/2002 |
| KR | 10-2006-0062543 A | | 6/2006 |
| KR | 10-2006-0098771 A | | 9/2006 |
| KR | 10-2014-0145427 A | | 12/2014 |
| KR | 10-2016-0000753 A | | 1/2016 |
| TW | 516052 B | | 1/2003 |

OTHER PUBLICATIONS

Notice of Office Action issued in Korean Patent Application No. 10-2016-0092030, dated Jul. 13, 2017.

Non-Final Office Action issued in U.S. Appl. No. 15/449,147, dated Jan. 16, 2018.

Final Office Action issued in U.S. Appl. No. 15/449,147, dated May 25, 2018.

Office Action issued in Chinese Application No. 201710281568.9 dated Sep. 25, 2019, with English translation.

* cited by examiner

CAPACITOR AND BOARD HAVING THE SAME

CROSS-REFERENCE TO RELATED APPLICATIONS

This application is a continuation of U.S. patent application Ser. No. 15/449,147, filed on Mar. 3, 2017 which claims the benefit of priority of Korean Patent Application No. 10-2016-0092030, filed on Jul. 20, 2016 in the Korean Intellectual Property Office, the disclosures of each are incorporated herein by reference in their entirety.

BACKGROUND

1. Field

The present disclosure relates to a capacitor and a board having the same.

2. Description of Related Art

Multilayer capacitors, examples of multilayer electronic components, can be mounted on the circuit boards of various types of electronic products such as image display devices, including liquid crystal display (LCD) devices, plasma display panel (PDP) devices, and the like, computers, personal digital assistants (PDA), cellular phones, and the like, to serve to charge or discharge electricity therein or therefrom.

The multilayer capacitors described above may be used as components of various electronic devices due to advantages thereof such as a small size, high capacitance, and ease of mounting. Recently, multilayer capacitors having high capacitance and high reliability have been developed.

In order to implement a high capacitance multilayer capacitor, various methods can be used to increase permittivity of a material forming the capacitor body or to thin dielectric layers and internal electrodes to increase the number of stacked dielectric layers and internal electrodes.

However, since it is not easy to develop a composition of a high-permittivity material, and there is a limitation in decreasing the thickness of the dielectric layer in a current process, there is a limitation in increasing capacitance of a product using the above-mentioned methods.

Therefore, in order to increase capacitance of the product while satisfying the trend for miniaturization of capacitors, research has been performed to develop a method of increasing an overlapping area of internal electrodes having different polarities. Further, as a mounting density of a circuit board is increased, an attempt has been conducted to decrease a mounting area and a mounting height of the multilayer capacitor.

SUMMARY

An aspect of the present disclosure may provide a capacitor providing increased capacitance by increasing an overlapping area of internal electrodes having different polarities while allowing the product to be miniaturized and providing improved reliability.

An aspect of the present disclosure may also provide a capacitor having a reduced mounting area.

According to an aspect of the present disclosure, a capacitor may include a body including a plurality of dielectric layers; first and second internal electrodes alternately disposed with respective dielectric layers interposed therebetween; and first and second insulating regions. The first insulating region is disposed in each of the first internal electrodes and includes a first connection electrode disposed therein. The second insulating region is disposed in each of the second internal electrodes and includes a second connection electrode disposed therein. In some examples, the products D1×Td and D2×Td are greater than 20 $\mu m^2$, where Td is a thickness of the dielectric layer, and D1 and D2 are widths of the first and second insulating regions, respectively.

According to another aspect of the present disclosure, aboard having a capacitor is provided. The board may effectively accommodate a capacitor having the above-mentioned structure, and may include a circuit board having an upper surface on which first and second electrode pads are formed. The capacitor is mounted on the first and second electrode pads of the circuit board. The capacitor includes a body including a plurality of dielectric layers; first and second internal electrodes alternately disposed with respective dielectric layers interposed therebetween; and first and second insulating regions. The first insulating region is disposed in each of the first internal electrodes and includes a first connection electrode disposed therein. The second insulating region is disposed in each of the second internal electrodes and includes a second connection electrode disposed therein. The products D1×Td and D2×Td are greater than 20 $\mu m^2$, where Td is a thickness of the dielectric layer, and D1 and D2 are widths of the first and second insulating regions, respectively.

According to another aspect of the present disclosure, a capacitor includes a body including a plurality of dielectric layers; first and second internal electrodes alternately disposed with respective dielectric layers interposed therebetween; and first and second insulating regions. The first insulating region is disposed in each of the first internal electrodes and includes a first connection electrode disposed therein. The second insulating region is disposed in each of the second internal electrodes and includes a second connection electrode disposed therein. The products D1×Td and D2×Td are 60 $\mu m^2$ or less, where Td is a thickness of the dielectric layer, and D1 and D2 are widths of the first and second insulating regions, respectively.

According to a further aspect of the present disclosure, a capacitor includes a body including a plurality of dielectric layers; first and second internal electrodes alternately disposed with respective dielectric layers interposed therebetween; and first, second, third, and fourth insulating regions. The first and second insulating regions are disposed in each of the first internal electrodes and respectively include first and second connection electrodes disposed therein. The third and fourth insulating regions are disposed in each of the second internal electrodes and respectively include third and fourth connection electrodes disposed therein. The first and second connection electrodes interconnect the second internal electrodes, and the third and fourth connection electrodes interconnect the first internal electrodes.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Directions of a capacitor body will be defined in order to clearly describe exemplary embodiments in the present disclosure. X, Y, and Z directions illustrated in the accompanying drawings refer to a length direction, a width direction, and a thickness direction, respectively. The length direction may be defined as a first direction, the width direction may be defined as a second direction, and the thickness direction may be defined as a third direction. Here, the thickness direction may be the same as a stacking direction in which dielectric layers and internal electrodes are stacked.

Further, in the present exemplary embodiment, for convenience of explanation, the surfaces of a capacitor body 110 opposing each other in the Z direction will be defined as first and second surfaces S1 and S2, the surfaces of the capacitor body 110 opposing each other in the X direction and connecting ends of the first and second surfaces S1 and S2 to each other will be defined as third and fourth surfaces S3 and S4, and the surfaces of the capacitor body 110 opposing each other in the Y direction and connecting ends of the first and second surfaces S1 and S2 to each other and connecting the third and fourth surfaces S3 and S4 to each other, respectively, will be defined as fifth and sixth surfaces S5 and S6. Here, the second surface S2 may be the same as a mounting surface.

Figure 1:
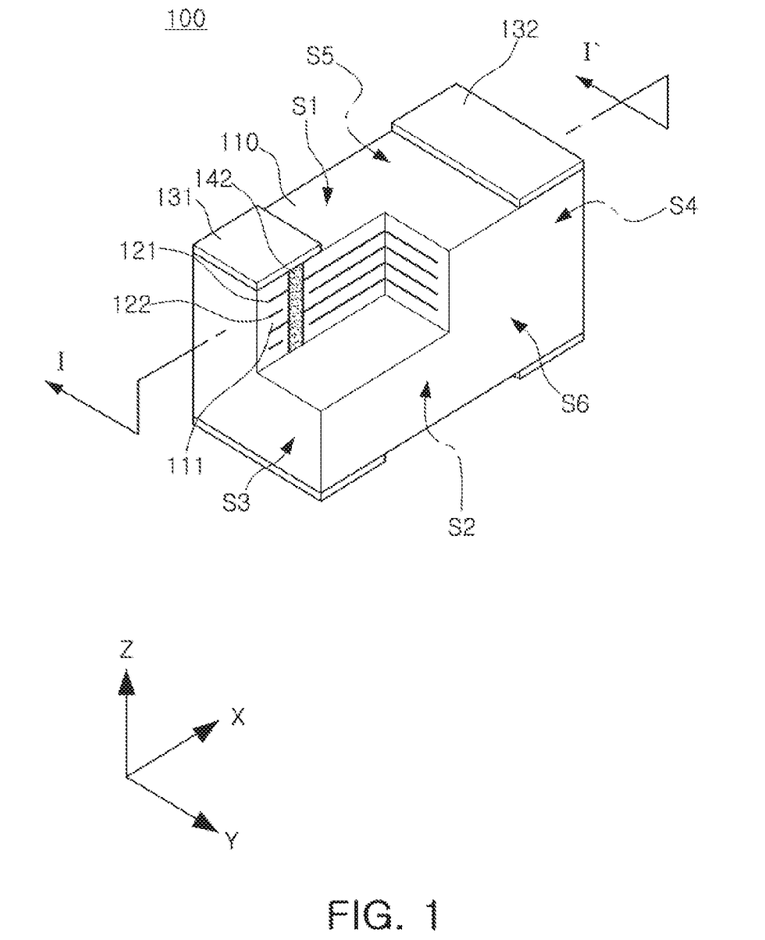
FIG. 1 is a cut-away perspective view schematically illustrating a capacitor according to a first exemplary embodiment.
Figure 2:
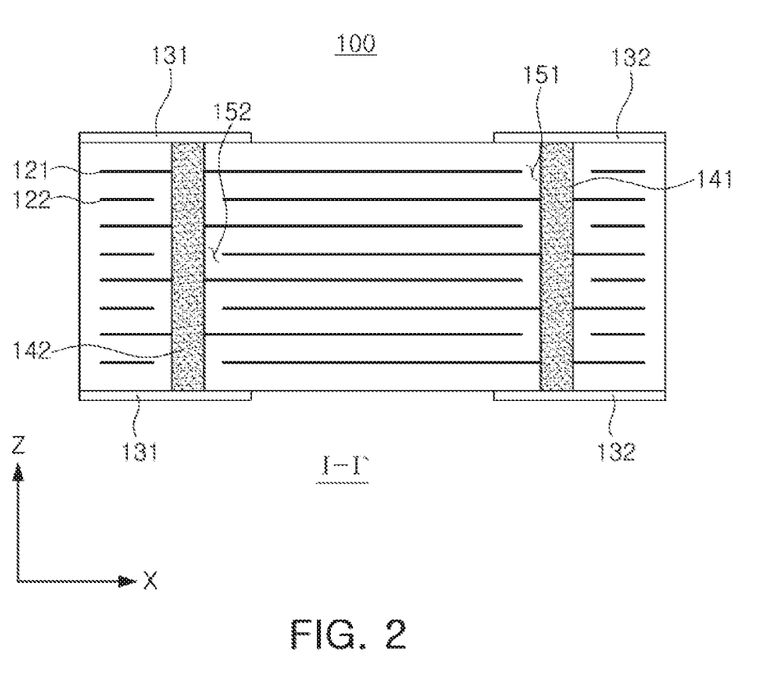
FIG. 2 is a schematic cross-sectional view taken along line I-I' of FIG. 1.
Figure 3A:
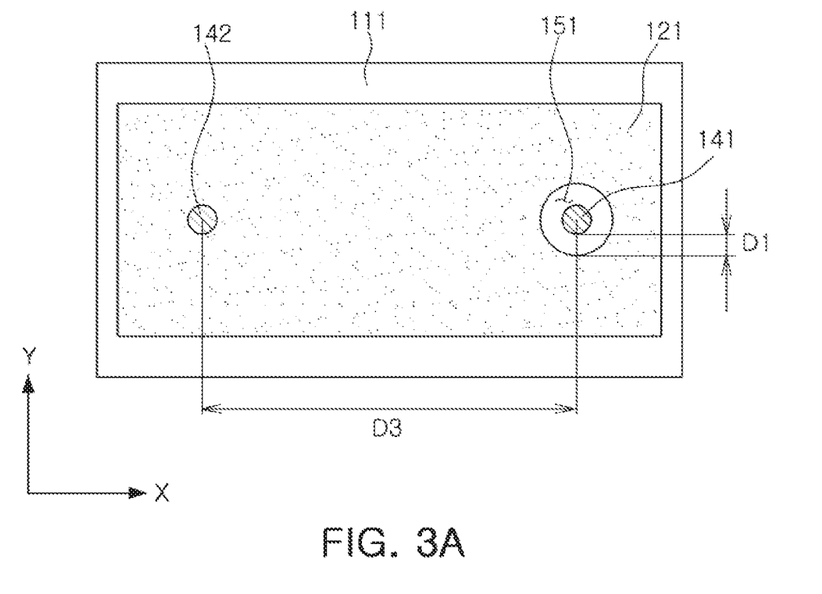
FIGS. 3A and 3B are plan views illustrating first and second internal electrodes in the capacitor of FIG. 1, respectively.
Figure 3B:
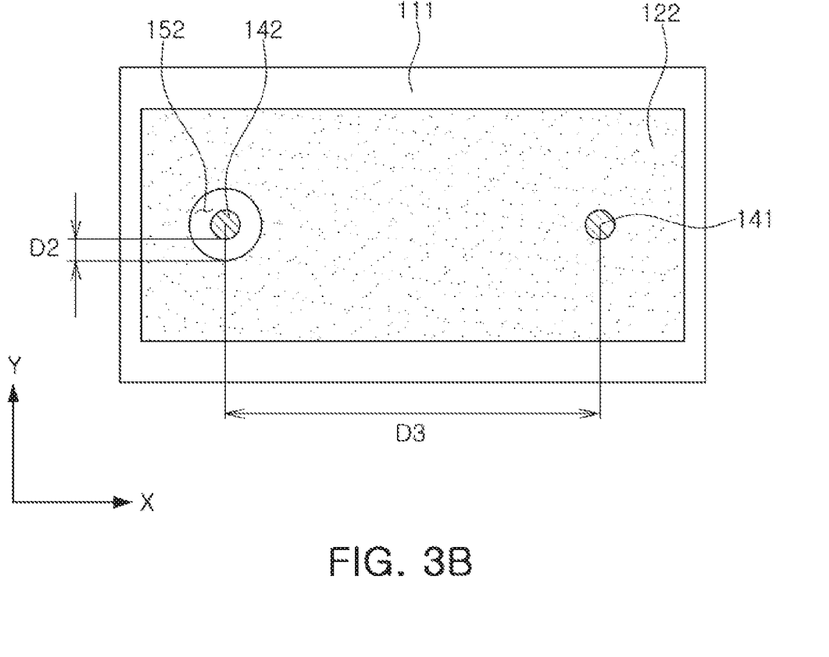

FIG. 1 is a cut-away perspective view schematically illustrating a capacitor 100 according to a first exemplary embodiment, FIG. 2 is a schematic cross-sectional view taken along line I-I' of FIG. 1, and FIGS. 3A and 3B are plan views illustrating first and second internal electrodes 121 and 122 in the capacitor 100 of FIG. 1, respectively.

Referring to FIGS. 1, 2, 3A, and 3B, the capacitor 100 according to the first exemplary embodiment may include a body 110 and first and second external electrodes 131 and 132 disposed on an external surface of the body 110.

The body 110 may be formed by stacking a plurality of dielectric layers 111, and may have an approximately hexahedral shape as illustrated, but a shape of the body 110 is not particularly limited thereto. Here, the shape and dimensions of the body 110 and the number of stacked dielectric layers 111 are not limited to those illustrated in the accompanying drawings.

In addition, the dielectric layers 111 may be in a sintered state, and adjacent dielectric layers 111 may be integrated with each other so that boundaries therebetween may not be readily apparent without the use of a scanning electron microscope (SEM).

The body 110 as described above may include an active region including the first and second internal electrodes 121 and 122 as a part contributing to capacitance formation of the capacitor and a margin part that does not contribute to capacitance formation, but is disposed in the vicinity of the active region.

The active region may be formed by repeatedly and alternately stacking a plurality of first and second internal electrodes 121 and 122 with respective dielectric layers 111 interposed therebetween. Here, a thickness Td of the dielectric layers ill may be arbitrarily altered depending on a capacitance design of the capacitor 100.

In addition, the dielectric layer ill may contain ceramic powder particles having high permittivity, for example, barium titanate ($BaTiO_3$)-based powder particles or strontium titanate ($SrTiO_3$)-based powder particles. However, a material of the dielectric layer 111 is not limited thereto. Further, the dielectric layer 111 may further contain at least one of ceramic additives, organic solvents, plasticizers, binders, dispersants, and the like, if necessary, in addition to the ceramic powder particles.

The margin part may be formed of the same material as that of the dielectric layer 111 and have the same configuration as that of the dielectric layer 111 except that the margin part does not include the internal electrodes of the body 110.

The margin part may serve to prevent the first and second internal electrodes 121 and 122 from being damaged by physical or chemical stress.

The first and second internal electrodes 121 and 122 may be electrodes having different polarities from each other.

The first and second internal electrodes 121 and 122 may be alternately disposed in the body 110 in the Z direction with respective dielectric layers 111 interposed therebetween, be formed by printing a conductive paste containing a conductive metal on the dielectric layer 111 at a predetermined thickness, and be electrically insulated from each other by the dielectric layers 111 interposed therebetween.

The conductive metal contained in the conductive paste may be, for example, nickel (Ni), copper (Cu), palladium (Pd), or alloys thereof. However, the conductive metal contained in the conductive paste is not limited thereto. In addition, a method of printing the conductive paste may be a screen printing method, a gravure printing method, or the like. However, the method of printing the conductive paste according to the present disclosure is not limited thereto.

An overlapping area between the first and second internal electrodes 121 and 122 in the Z direction is associated with capacitance of the capacitor.

First internal electrodes 121 adjacent to each other may be electrically connected to each other through a second connection electrode 142, and second internal electrodes 122 adjacent to each other may be electrically connected to each other through a first connection electrode 141.

The first and second connection electrodes 141 and 142 may be disposed to entirely or at least partially penetrate through the body 110.

Further, the first and second internal electrodes 121 and 122 may include first and second insulating regions 151 and 152.

The first insulating region 151 may serve to prevent the first connection electrode 141 and the first internal electrodes 121 from being electrically connected to each other, and the second insulating region 152 may serve to prevent the second connection electrode 142 and the second internal electrodes 122 from being electrically connected to each other.

That is, the first connection electrode 141 may be positioned in an interior, that is, a central portion, of the first insulating region 151, such that the first connection electrode 141 and the first internal electrodes 121 may be disposed to be spaced apart from each other.

Further, the second connection electrode 142 may be positioned in the interior, that is, a central portion, of the second insulating region 152, such that the second connection electrode 142 and the second internal electrodes 122 may be disposed to be spaced apart from each other.

Therefore, since the first connection electrode 141 contacts the second internal electrodes 122 while the second connection electrode 142 is spaced apart from the second internal electrodes 122 by the second insulating region 152, the first connection electrode 141 may only be electrically connected to the plurality of second internal electrodes 122 and not connected to the first internal electrodes 121.

Since the second connection electrode 142 contacts the first internal electrodes 121 but the first connection electrode 141 is spaced apart from the first internal electrodes 121 by the first insulating region 151, the second connection electrode 142 may be electrically connected only to the plurality of first internal electrodes 121 and not connected to the second internal electrodes 122.

In addition, the first and second external electrodes 131 and 132 may be disposed on the second surface S2 of the body 110 to be spaced apart from each other in the X direction. The first external electrode 131 may contact a portion of the second connection electrode 142 exposed to the second surface S2 of the body 110 to thereby be connected thereto. The second external electrode 132 may contact a portion of the first connection electrode 141 exposed to the second surface S2 of the body 110 to thereby be connected thereto.

Thus, in the capacitor 100 according to the first exemplary embodiment, the first internal electrodes 121 may be connected to the first external electrode 131 through the second connection electrode 142, and the second internal electrodes 122 may be connected to the second external electrode 132 through the first connection electrode 141, and a short-circuit may be prevented in the insulating regions 151 and 152, while the overlapping area between the first and second internal electrodes 121 and 122 may be increased as much as possible.

Therefore, capacitance of the capacitor may be increased without applying a method of reducing thicknesses of dielectric layers 111 and internal electrodes to increase the number of stacked internal electrodes according to the related art, or the like. Further, since the same kinds of internal electrodes 121 and 122 are electrically connected to each other through the connection electrodes 142 and 141, respectively, even in a case of an ultra-thin product of which a thickness of a body is 80 μm or less, connectivity of the internal electrodes may be improved.

The following Table 1 illustrates results obtained by measuring an increase in overlapping area in a case in which internal electrodes include an insulating region when an overlapping area of internal electrodes in a general internal electrode structure according to the related art is assumed as 1.

TABLE 1

| Size of Capacitor | Inventive Example |
| --- | --- |
| 0603 (L × W = 0.6 mm × 0.3 mm) | 105~130% |
| 1005 (L × W = 1.0 mm × 0.5 mm) | 115~130% |

The first connection electrode 141 may be formed by filling a via with a conductive material. The first connection electrode 141 may contact the second internal electrodes 122 to electrically connect the plurality of second internal electrodes 122 stacked in the Z direction to each other. Here, one end of the first connection electrode 141 in the Z direction may be exposed to the second surface S2 of the body 110.

The second connection electrode 142 may be formed by filling a via with the conductive material. The second connection electrode 142 may contact the first internal electrodes 121 to electrically connect the plurality of first internal electrodes 121 stacked in the Z direction to each other. Here, one end of the second connection electrode 142 in the Z direction may be exposed to the second surface S2 of the body 110.

The first and second connection electrodes 141 and 142 may be formed of a conductive paste containing a conductive metal. In addition, the conductive metal may be, for example, nickel (Ni), copper (Cu), palladium (Pd), gold (Au), or alloys thereof, but is not limited thereto.

Although a case in which shapes of the first and second insulating regions 151 and 152 are circles is illustrated in the present exemplary embodiment, the shapes of the first and second insulating regions 151 and 152 are not limited thereto. If necessary, the shapes of the first and second insulating regions 151 and 152 may be variously changed to semi-circles, tetragons, triangles, or the like.

As described above, the first and second connection electrodes 141 and 142 may be formed by filling the via with the conductive material.

Here, the via may be formed in a ceramic green sheet using a laser drilling method, a punching method, or the like, or may be formed by processing a multilayer body after stacking ceramic green sheets on which internal electrodes are formed.

At the time of processing the via as described above, cracks may occur from a surface of the via by physical impact. In addition, while the via filled with the conductive material is subjected to heat treatment such as sintering, or the like, cracks may occur around the first and second connection electrodes 141 and 142 due to a difference in coefficients of thermal expansion between the dielectric layer 111 and the conductive material filled in the via.

In a case in which cracks occur around the first and second connection electrodes 141 and 142, the first internal electrode 121 may be electrically connected to the first connection electrode 141 by the cracks, the second internal electrode 122 may be electrically connected to the second connection electrode 142 by the cracks, or insulation breakdown may occur.

It may be appreciated that a propagation distance of the cracks as described above is inversely proportional to the thickness Td of the dielectric layer 111 (e.g., inversely proportional to a distance between adjacent internal electrodes 121 and 122 in the stack of internal electrodes). Particularly, in a case in which the dielectric layer 111 is formed to have a thickness of 1 μm or less in order to improve capacitance of the capacitor, short-circuit and insulation breakdown problems due to the cracks may be increased.

Therefore, in the capacitor 100 according to the first exemplary embodiment, the products of the thickness Td of the dielectric layer 111 and widths D1 and D2 of the first and second insulating regions 151 and 152, respectively, may be maintained greater than 20 μm$^2$, such that even though the cracks occur around the first and second connection electrodes 141 and 142, a short-circuit may be prevented, and thus, reliability of the capacitor may be improved.

The widths D1 and D2 of the first and second insulating regions 151 and 152 may mean minimum distances from an outermost portion of the first or second connection electrode 141 or 142 disposed in the inside of the first or second insulating region 151 or 152 to the first or second internal electrodes 121 and 122, respectively. The thickness Td of the dielectric layer 111 generally corresponds to an average thickness of the dielectric layers 111 disposed between adjacent internal electrodes 121 and 122 in the capacitor 100. In some examples, however, the thickness Td may correspond to a minimum or median thickness of the dielectric layers 111 disposed between adjacent internal electrodes 121 and 122 in the capacitor 100.

The following Table 2 illustrates results obtained by measuring short-circuit occurrence, insulation breakdown, and capacitance depending on the widths D1 and D2 of the first and second insulating regions 151 and 152 when the thickness Td of the dielectric layer 111 is 1 μm, and the following Table 3 illustrates results obtained by measuring short-circuit occurrence, insulation breakdown, and capacitance depending on the widths D1 and D2 of the first and second insulating regions 151 and 152 when the thickness Td of the dielectric layer 111 is 0.8 μm, and the following Table 4 illustrates results obtained by measuring short-circuit occurrence, insulation breakdown, and capacitance depending on the widths D1 and D2 of the first and second insulating regions 151 and 152 when the thickness Td of the dielectric layer 111 is 0.6 μm.

TABLE 2

| Inventive Example | D1, D2 (μm) | D1 × Td, D2 × Td (μm$^2$) | Short-Circuit | Breakdown Voltage | Capacitance |
|---|---|---|---|---|---|
| 1 | 10 | 10 | X | X | ⊚ |
| 2 | 15 | 15 | X | X | ⊚ |
| 3 | 20 | 20 | ○ | X | ⊚ |
| 4 | 25 | 25 | ○ | ○ | ○ |
| 5 | 30 | 30 | ○ | ○ | ○ |
| 6 | 35 | 35 | ○ | ○ | ○ |
| 7 | 40 | 40 | ○ | ○ | ○ |
| 8 | 45 | 45 | ○ | ○ | ○ |
| 9 | 50 | 50 | ○ | ○ | ○ |
| 10 | 55 | 55 | ○ | ○ | ○ |
| 11 | 60 | 60 | ○ | ○ | ○ |
| 12 | 65 | 65 | ○ | ○ | X |
| 13 | 70 | 70 | ○ | ○ | X |
| 14 | 75 | 75 | ○ | ○ | X |
| 15 | 80 | 80 | ○ | ○ | X |

TABLE 3

| Inventive Example | D1, D2 (μm) | D1 × Td, D2 × Td (μm$^2$) | Short-Circuit | Breakdown Voltage | Capacitance |
|---|---|---|---|---|---|
| 16 | 10 | 8 | X | X | ⊚ |
| 17 | 15 | 12 | X | X | ⊚ |
| 18 | 20 | 16 | ○ | X | ⊚ |
| 19 | 25 | 20 | ○ | X | ⊚ |
| 20 | 30 | 24 | ○ | ○ | ○ |
| 21 | 35 | 28 | ○ | ○ | ○ |
| 22 | 40 | 32 | ○ | ○ | ○ |
| 23 | 45 | 36 | ○ | ○ | ○ |
| 24 | 50 | 40 | ○ | ○ | ○ |
| 25 | 55 | 44 | ○ | ○ | ○ |
| 26 | 60 | 48 | ○ | ○ | ○ |
| 27 | 65 | 52 | ○ | ○ | ○ |
| 28 | 70 | 56 | ○ | ○ | ○ |
| 29 | 75 | 60 | ○ | ○ | ○ |
| 30 | 80 | 64 | ○ | ○ | X |

TABLE 4

| Inventive Example | D1, D2 (μm) | D1 × Td, D2 × Td (μm$^2$) | Short-Circuit | Breakdown Voltage | Capacitance |
|---|---|---|---|---|---|
| 31 | 10 | 6 | X | X | ⊚ |
| 32 | 15 | 9 | X | X | ⊚ |
| 33 | 20 | 12 | X | X | ⊚ |
| 34 | 25 | 15 | X | X | ⊚ |
| 35 | 30 | 18 | ○ | X | ⊚ |
| 36 | 35 | 21 | ○ | ○ | ○ |
| 37 | 40 | 24 | ○ | ○ | ○ |
| 38 | 45 | 27 | ○ | ○ | ○ |
| 39 | 50 | 30 | ○ | ○ | ○ |
| 40 | 55 | 33 | ○ | ○ | ○ |
| 41 | 60 | 36 | ○ | ○ | ○ |
| 42 | 65 | 39 | ○ | ○ | ○ |
| 43 | 70 | 42 | ○ | ○ | ○ |
| 44 | 75 | 45 | ○ | ○ | ○ |
| 45 | 80 | 48 | ○ | ○ | ○ |

At the time of determining whether or not a short-circuit occurred, a case in which a short-circuit occurred in one or more of 100 capacitors is indicated by ×, and a case in which there was no short-circuit is indicated by ○.

While a direct current (DC) voltage was applied at a rate of 10V/sec, breakdown voltage (BDV) characteristics were evaluated. When the thickness Td of the dielectric layer 111 is 1 μm (e.g., Table 2), cases in which the breakdown voltage is less than 70V are indicated by ×, and cases in which the breakdown voltage is 70V or more are indicated by ○. Provided that, when the thickness Td of the dielectric layer 111 is 0.8 μm (e.g., Table 3), the breakdown voltage is indicated based on 40V threshold, and when the thickness Td of the dielectric layer 111 is 0.6 μm (e.g., Table 4), the breakdown voltage is indicated based on 15V threshold.

At the time of evaluating capacitance, when capacitance of a capacitor having a general structure having the same number of layers is defined as 1, a case in which capacitance of the capacitor according to the first exemplary embodiment is equal to or less than 100% of capacitance of the capacitor having the general structure is indicated by ×, a case in which capacitance of the capacitor according to the first exemplary embodiment is greater than 100% of capacitance of the capacitor having the general structure is indicated by ○, and a case in which capacitance of the capacitor according to the first exemplary embodiment is equal to or greater than 115% of capacitance of the capacitor having the general structure is indicated by ⊚.

Referring to Tables 2 to 4, in a case in which D1×Td and D2×Td are 20 µm² or less, the breakdown voltage is decreased to be less than a reference voltage.

Therefore, in the capacitor 100 according to the first exemplary embodiment, the short-circuit and insulation breakdown problems may be prevented by allowing D1×Td and D2×Td to be greater than 20 µm², such that reliability of the capacitor 100 may be improved.

Further, in a case in which D1×Td and D2×Td are greater than 60 µm², there occurs a problem in that capacitance of the capacitor is equal to or less than that of the capacitor having the general structure.

Therefore, the capacitor 100 according to the first exemplary embodiment may have high capacitance by allowing D1×Td and D2×Td to be 60 µm² or less.

As the thickness Td of the dielectric layer 111 is decreased, capacitance of the capacitor may be increased, but the propagation distance of the cracks around the first and second connection electrodes 141 and 142 may be increased.

Therefore, in a case in which D1×Td and D2×Td are greater than 20 µm² and not more than 60 µm² as in the capacitor 100 according to the first exemplary embodiment, the capacitor may have high capacitance and may at the same time exhibit improved reliability by preventing short-circuits or insulation breakdown.

A distance D3 between the first and second connection electrodes 141 and 142 may be equal to or less than 85% of a length of the body 110 in the X direction.

As described above, currents having different polarities flow in the first and second connection electrodes 141 and 142.

In the capacitor 100 according to the first exemplary embodiment, the distance D3 between the first and second connection electrodes 141 and 142 may be equal to or less than 85% of the length of the body 110 in the X direction, such that magnetic fields from the currents flowing through the first and second connection electrodes 141 and 142 may be offset by each other, which may decrease equivalent series inductance (ESL).

However, in order to prevent a short-circuit between the first and second connection electrodes 141 and 142 and secure an area required for forming the first and second external electrodes 131 and 132, the distance D3 between the first and second connection electrodes 141 and 142 may be greater than a sum of radii of the first and second connection electrodes 141 and 142, the widths D1 and D2 of the first and second insulating regions 151 and 152, and a minimum interval (20 µm) between the insulating vias.

In the capacitor 100 configured as described above, since volumes of the external electrodes and an overall height of the capacitor may be significantly decreased, relatively, a volume and a height usable to increase sizes of the internal electrodes may be further secured, such that capacitance of the capacitor may be further improved in accordance therewith. Further, since a thickness of the capacitor is significantly decreased, a thin film multilayer capacitor having a thickness of 100 µm or less may be manufactured.

Figure 4:
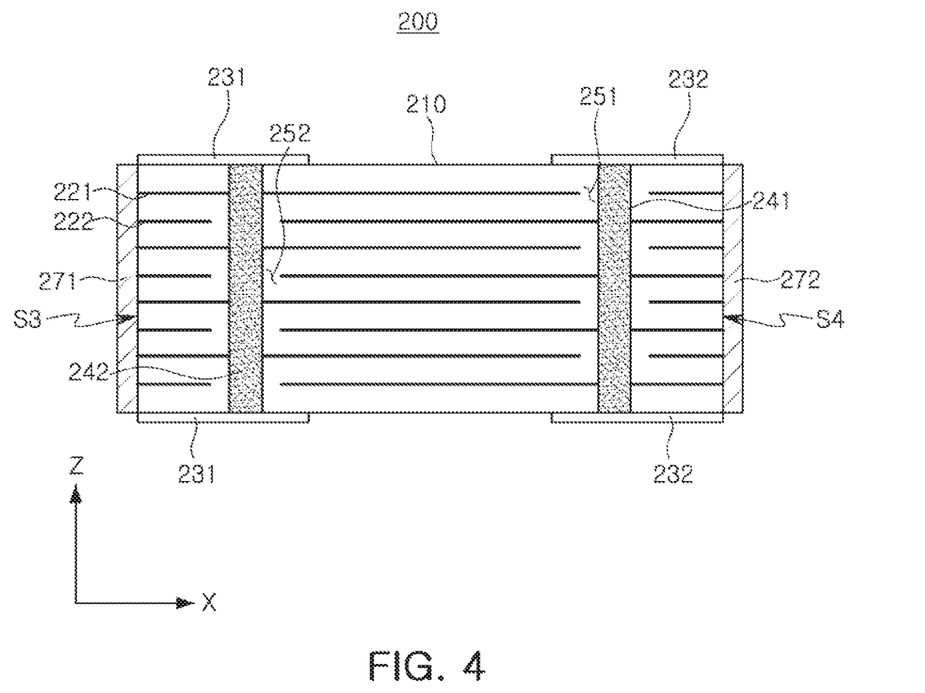
FIG. 4 is a cross-sectional view schematically illustrating a capacitor according to a second exemplary embodiment.
Figure 5A:
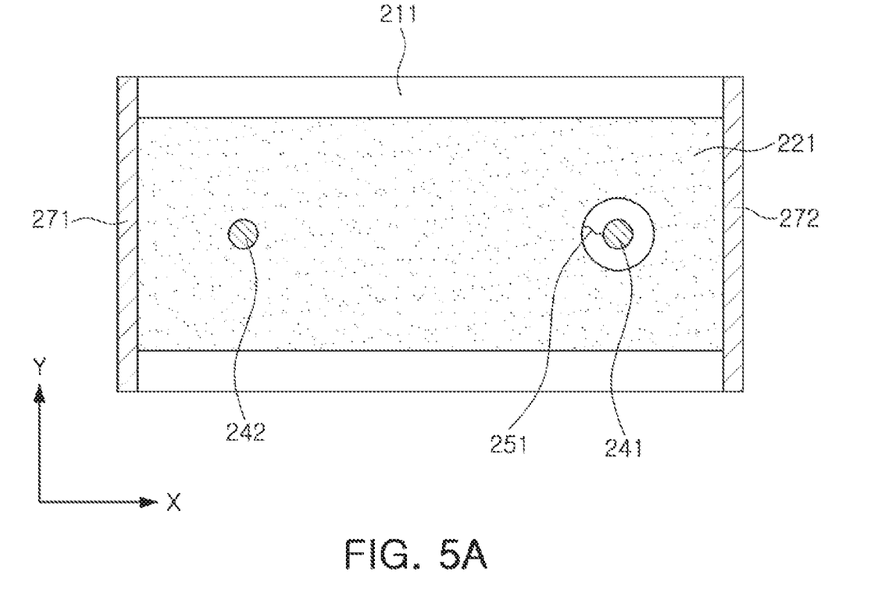
FIGS. 5A and 5B are plan views illustrating first and second internal electrodes in the capacitor of FIG. 4, respectively.
Figure 5B:
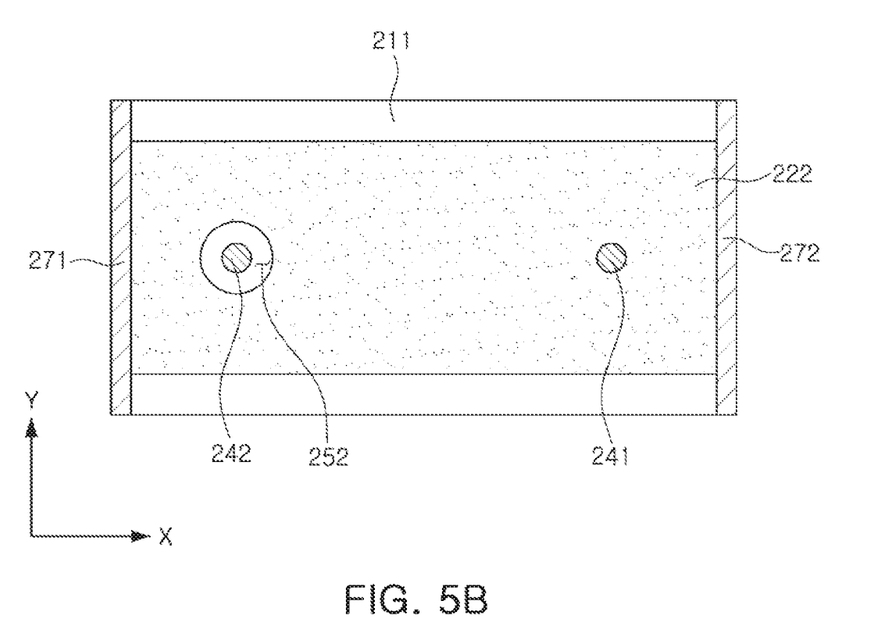

FIG. 4 is a cross-sectional view schematically illustrating a capacitor 200 according to a second exemplary embodiment, and FIGS. 5A and 5B are plan views illustrating first and second internal electrodes in the capacitor 200 of FIG. 4, respectively.

A detailed description of contents similar to those in the capacitor 100 according to the first exemplary embodiment described above will be omitted in order to avoid overlapped descriptions.

Referring to FIGS. 4 through 5B, at least portions of first and second internal electrodes 221 and 222 may be exposed to side surfaces of a body 210.

For example, the first and second internal electrodes 221 and 222 may be exposed to third and fourth surfaces S3 and S4 of the body 210.

Although a case in which the first and second internal electrodes 221 and 222 are exposed to the third and fourth surfaces S3 and S4 of the body 210 is illustrated in FIGS. 4 through 5B, the first and second internal electrodes 221 and 222 are not limited thereto.

For example, the first and second internal electrodes 221 and 222 may be exposed to any one or more of the side surfaces of the body 210, that is, third to sixth surfaces S3 to S6 of the body 210.

In the capacitor 200 according to the second exemplary embodiment, the first and second internal electrodes 221 and 222 may be formed to be exposed to the side surfaces of the body 210, such that an overlapping area between the first and second internal electrodes 221 and 222 may be significantly increased.

Similarly to the capacitor 100 according to the first exemplary embodiment, the capacitor 200 according to the second exemplary embodiment may be formed so that D1×Td and D2×Td are greater than 20 µm², such that occurrence of a short-circuit and insulation breakdown may be prevented.

Since in the capacitor 200 according to the second exemplary embodiment, the first and second internal electrodes 221 and 222 are exposed to the side surfaces of the body 210, the capacitor 200 may further include insulating layers 271 and 272 covering portions of the first and second internal electrodes 221 and 222 exposed to the side surfaces of the body 210.

That is, as illustrated in FIGS. 4 through 5B, the first and second insulating layers 271 and 272 may be formed on the third and fourth surfaces S3 and S4 of the body 210. The first and second insulating layers 271 and 272 may be formed by molding the third and fourth surfaces S3 and S4 of the body 210 with a non-conductive material, or attaching the desired number of separate ceramic sheets, or the like, to the third and fourth surfaces S3 and S4 of the body 210, but a method of forming the first and second insulating layers 271 and 272 is not limited thereto.

Here, the first and second insulating layers 271 and 272 may be formed of at least one of an insulating resin, an insulating ceramic, and an insulating resin and a filler, but a material of the first and second insulating layers 271 and 272 is not limited thereto.

The first and second insulating layers 271 and 272 as described above may serve to cover the portions of the first and second internal electrodes 221 and 222 exposed to the third and fourth surfaces S3 and S4 of the body 210. Further, the first and second insulating layers 271 and 272 may improve durability of the body 210 and may further secure a margin having a predetermined thickness, thereby serving to improve reliability of the capacitor.

Meanwhile, since the first and second insulating layers 271 and 272 are formed after forming the body 210, in a case of significantly decreasing the thickness of the first and second insulating layers 271 and 272 as long as an insulation property, durability of a capacitor body, and reliability of the capacitor are maintained at a predetermined level, a size of a product may be significantly decreased.

Figure 6A:
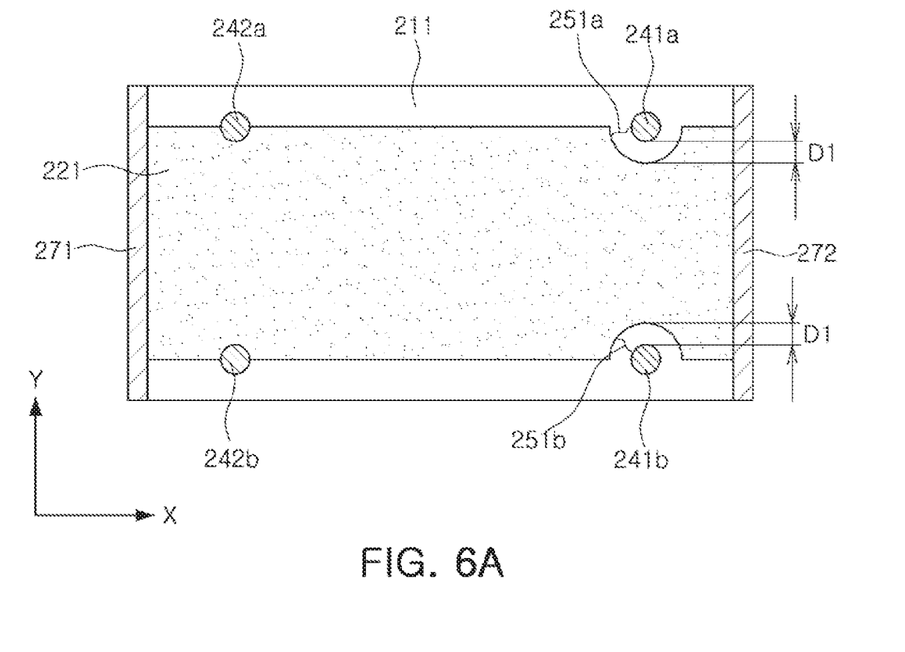
FIGS. 6A and 6B are plan views illustrating other examples of the first and second internal electrodes in the capacitor of FIG. 4, respectively.
Figure 6B:
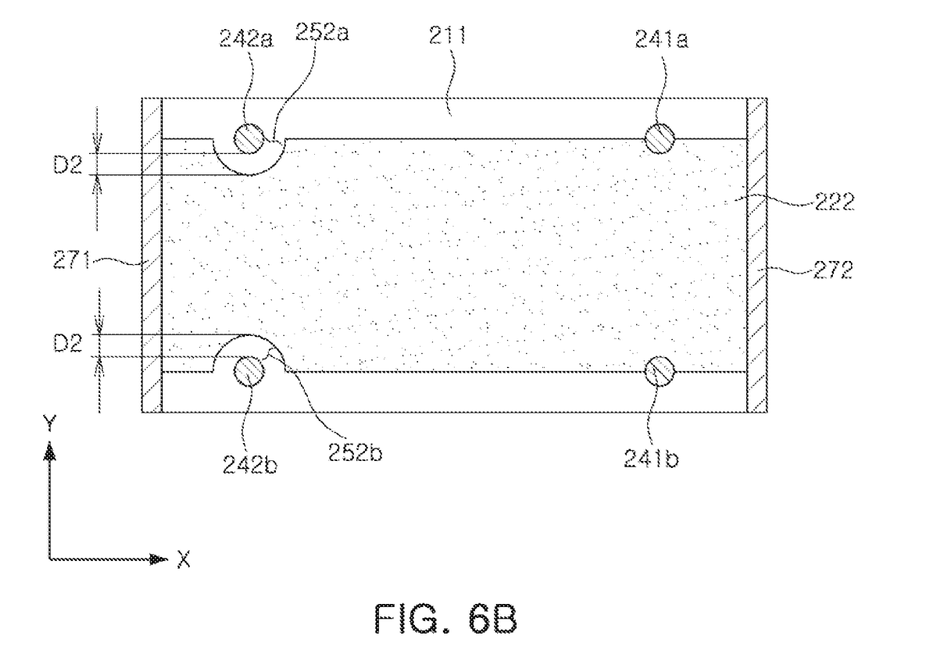

FIGS. 6A and 6B are plan views illustrating other examples of the first and second internal electrodes in the capacitor 200 of FIG. 4, respectively.

Referring to FIGS. 6A and 6B, first and second connection electrodes 241a, 241b, 242a, and 242b may be disposed at edges of first and second internal electrodes 221 and 222.

In a case in which the first and second connection electrodes are disposed in the insides of the first and second internal electrodes 221 and 222 (e.g., as in FIGS. 5A and 5B), the first and second insulating regions 251 and 252 need to be disposed in the insides of the first and second internal electrodes 221 and 222.

Therefore, an overlapping area between the first and second internal electrodes 221 and 222 may inevitably be decreased by the first and second insulating regions 251 and 252.

However, when the first and second connection electrodes 241a, 241b, 242a, and 242b are disposed at the edges of first and second internal electrodes 221 and 222 as illustrated in FIGS. 6A and 6B, first and second insulating regions 251a, 251b, 252a, and 252b may also be disposed at the edges of the first and second internal electrodes 221 and 222, such that the overlapping area between the first and second internal electrodes 221 and 222 may be increased.

Further, the capacitor 200 may include at least two first and second connection electrodes 241a, 241b, 242a, and 242b and at least two first and second insulating regions 251a, 251b, 252a, and 252b, respectively, such that connectivity between the first internal electrodes 221 and between the second internal electrodes 222 may be improved.

In a case in which the capacitor 200 includes at least two first and second connection electrodes 241a, 241b, 242a, and 242b and at least two first and second insulating regions 251a, 251b, 252a, and 252b, respectively, and at the same time, the first and second connection electrodes 241a, 241b, 242a, and 242b are disposed at the edges of the first and second internal electrodes 221 and 222, a decrease in overlapping area between the first and second internal electrodes 221 and 222 may be prevented, and connectivity between the internal electrodes may be improved.

In the capacitor 200 configured as described above, volumes of the external electrodes 231 and 232 and an overall height of the capacitor 200 may be significantly decreased, and thus, relatively, a volume and a height capable of increasing sizes of the internal electrodes 221 and 222 may be further secured, such that capacitance of the capacitor may be further improved in accordance therewith. Further, since a thickness of the capacitor is significantly decreased, a thin film multilayer capacitor having a thickness of 100 μm or less may be manufactured.

Figure 7:
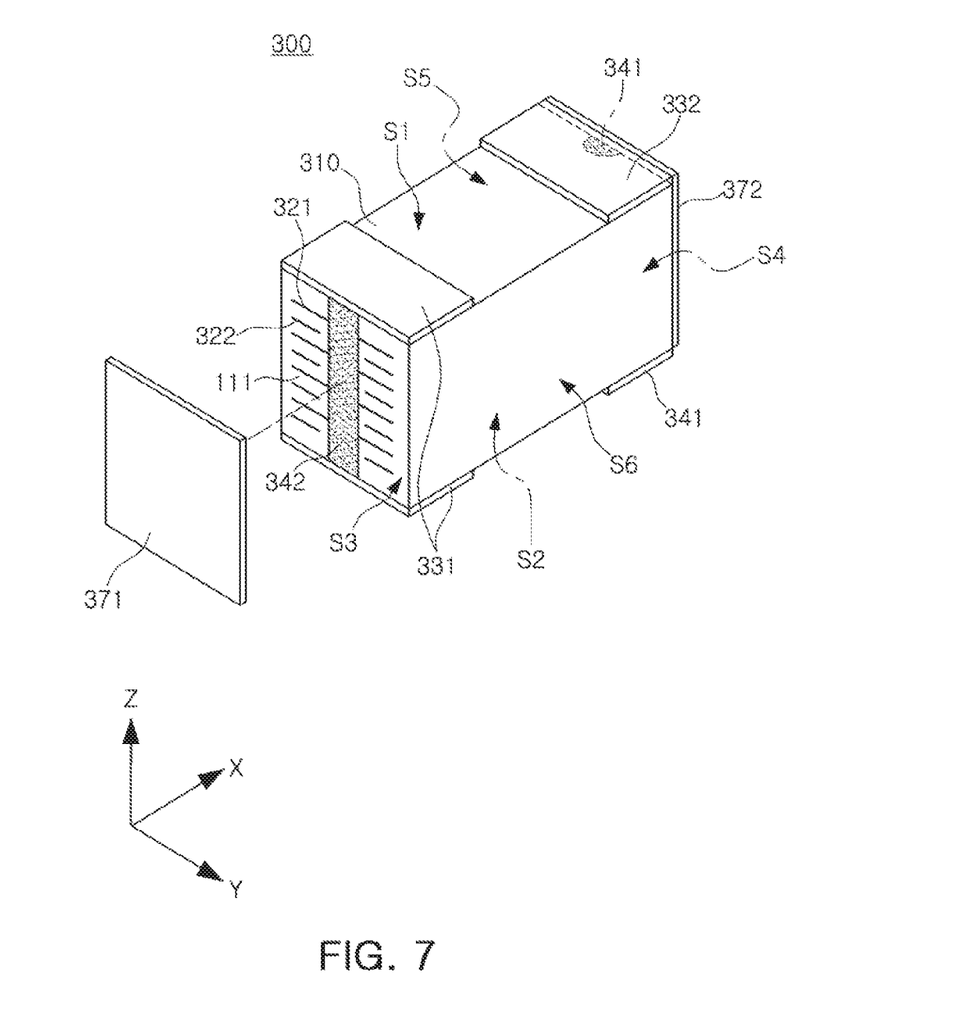
FIG. 7 is an exploded perspective view schematically illustrating a capacitor according to a third exemplary embodiment.
Figure 8A:
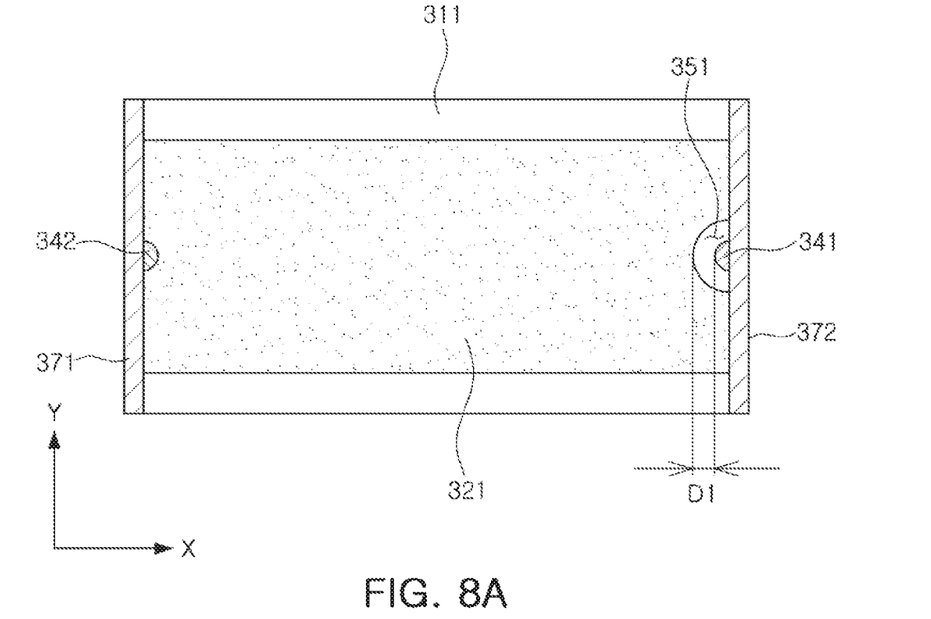
FIGS. 8A and 8B are plan views illustrating first and second internal electrodes in the capacitor of FIG. 7, respectively.
Figure 8B:
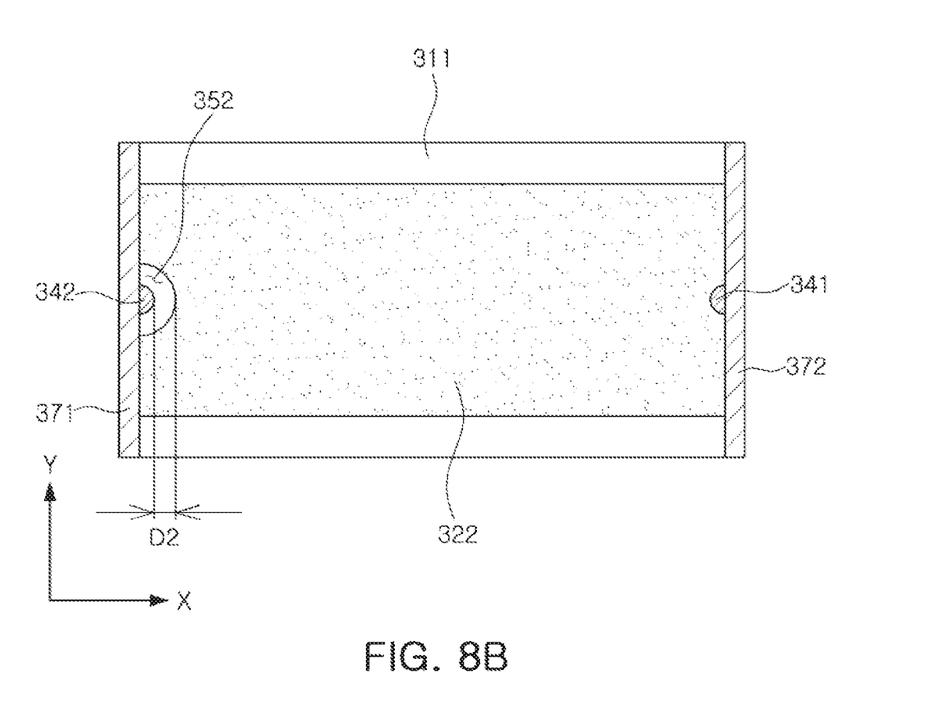
Figure 9:
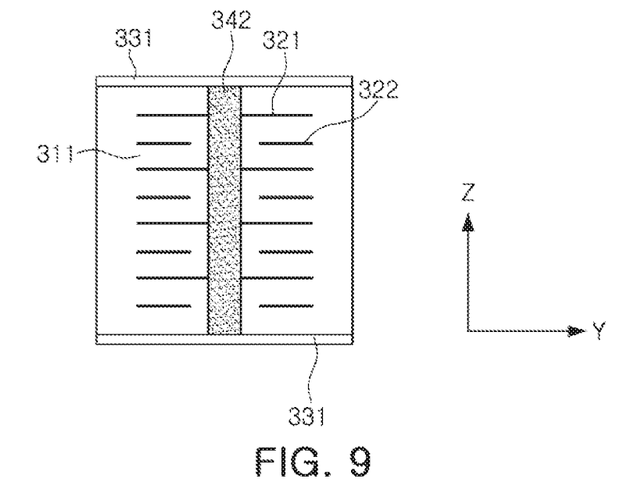
FIG. 9 is a side view of a body of FIG. 7.

FIG. 7 is an exploded perspective view schematically illustrating a capacitor 300 according to a third exemplary embodiment, FIGS. 8A and 8B are plan views illustrating first and second internal electrodes 321 and 322 in the capacitor 300 of FIG. 7, respectively, and FIG. 9 is a side view of a body 310 of FIG. 7.

A detailed description of contents similar to those in the capacitors 100 and 200 according to the first and second exemplary embodiments described above will be omitted in order to avoid overlapped descriptions.

Referring to FIGS. 7, 8A, 8B, and 9, first and second connection electrodes 341 and 342 may be formed on third and fourth surfaces S3 and S4 of the body 310 to be extended in a Z direction. However, first and second connection electrodes 341 and 342 are not limited thereto, but may be formed on one or more side surfaces of the body 310, that is, third to sixth surfaces S3 to S6 of the body 310 to be extended in the Z direction.

In addition, the first and second connection electrodes 341 and 342 may be disposed so that one or both ends thereof are exposed to first and/or second surfaces S1 and/or S2 of the body 310.

Further, first and second insulating layers 371 and 372 may be formed on the third and fourth surfaces S3 and S4 of the body 310. The first and second insulating layers 371 and 372 may be formed by molding the third and fourth surfaces S3 and S4 of the body 310 with a non-conductive material, or attaching the desired number of separate ceramic sheets, or the like, to the third and fourth surfaces S3 and S4 of the body 310, but a method of forming the first and second insulating layers 371 and 372 is not limited thereto.

Here, the first and second insulating layers 371 and 372 may be formed of at least one of an insulating resin, an insulating ceramic, and an insulating resin and a filler, but a material of the first and second insulating layers 371 and 372 is not limited thereto.

The first and second insulating layers 371 and 372 as described above may serve to cover portions of the first and second internal electrodes 321 and 322 exposed to the third and fourth surfaces S3 and S4 of the body 310 and portions of the first and second connection electrodes 341 and 342 exposed to the third and fourth surfaces S3 and S4 of the body 310. Further, the first and second insulating layers 371 and 372 may improve durability of the body 310 and further secure a margin having a predetermined thickness, thereby serving to improve reliability of the capacitor.

Meanwhile, since the first and second insulating layers 371 and 372 are formed after forming the body 310, in a case of significantly decreasing the thickness of the first and second insulating layers 371 and 372 as long as an insulation property, durability of a capacitor body, and reliability of the capacitor are maintained at a predetermined level, a size of a product may be significantly decreased.

In the capacitor 300 configured as described above, volumes of the external electrodes 331 and 332 and an overall height of the capacitor may be significantly decreased, and thus, relatively, a volume and a height capable of increasing sizes of the internal electrodes 321 and 322 may be further secured, such that capacitance of the capacitor may be further improved in accordance therewith. Further, since a thickness of the capacitor is significantly decreased, a thin film multilayer capacitor having a thickness of 100 μm or less may be manufactured.

Figure 10:
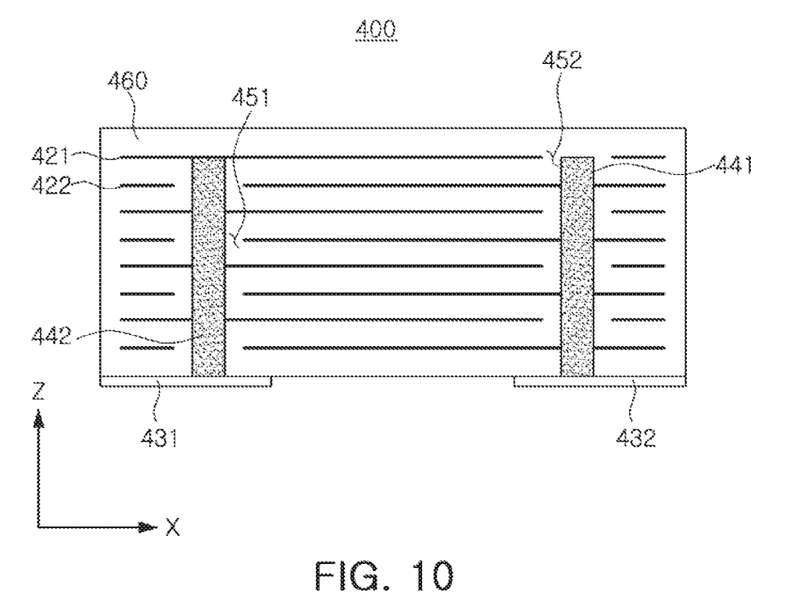
FIG. 10 is a cross-sectional view schematically illustrating a capacitor according to a fourth exemplary embodiment.

FIG. 10 is a cross-sectional view schematically illustrating a capacitor 400 according to a fourth exemplary embodiment.

A detailed description of contents similar to those in the capacitors 100 to 300 according to the first to third exemplary embodiments described above will be omitted in order to avoid overlapped descriptions.

Referring to FIG. 10, the capacitor 400 according to the fourth exemplary embodiment may further include a cover layer 460 disposed on an upper portion of body 410.

In the capacitor 400 according to the fourth exemplary embodiment, the cover layer 460 may be disposed on the upper portion of the body 410, thereby preventing first and second connection electrodes 441 and 442 from being exposed to a first surface S1 of the body 410.

In a case in which first and second external electrodes 431 and 432 are not formed on the first surface S1 of the body 410, which is a surface opposing a mounting surface S2, the cover layer 460 may prevent the first and second connection electrodes 441 and 442 from being exposed to the first surface S1 of the body 410, thereby preventing conductive foreign materials, or the like, from being introduced into the body 410 through the first and second connection electrodes 441 and 442.

Figure 11:
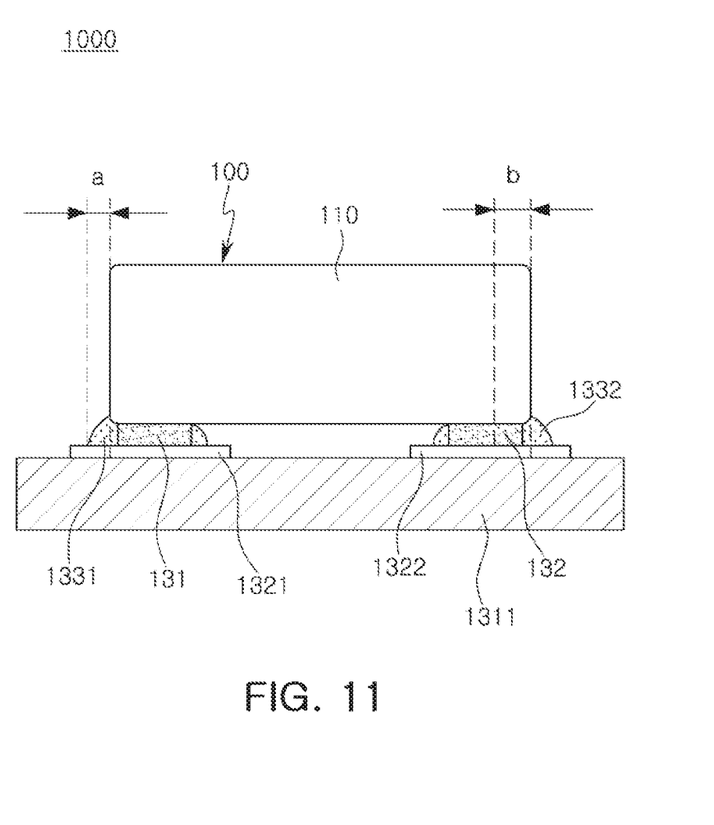
FIG. 11 is a cross-sectional view illustrating a board in which the capacitor of FIG. 1 is mounted on a circuit board.

FIG. 11 is a cross-sectional view illustrating a board including the capacitor of FIG. 1 mounted on a circuit board.

Referring to FIG. 11, a board 1000 having a capacitor according to the present exemplary embodiment may include a circuit board 1311 on which the capacitor 100 is mounted and the first and second electrode pads 1321 and 1322 formed on an upper surface of the circuit board 1311 to be spaced apart from each other.

Here, the capacitor 100 may be fixed by solders 1331 and 1332 to thereby be electrically connected to the electrode pads 1321 and 1322 of the circuit board 1311 in a state in which the first and second external electrodes 131 and 132 are positioned to contact the first and second electrode pads 1321 and 1322, respectively.

Since in the board having a capacitor as described above, the first and second external electrodes 131 and 132 of the capacitor 100 are exposed only to the mounting surface of the body 110, a formation area a of the solders 1331 and 1332 at the time of mounting the capacitor on the circuit board 1311 may be significantly decreased.

In a case in which the formation area a of the solders 1331 and 1332 is decreased as described above, acoustic noise may be decreased, and when it is assumed that the mounting area is the same as that of a capacitor according to the related art, a chip size may be increased by further securing a size by b, as compared to the capacitor according to the related art, capacitance of the capacitor may be relatively further increased.

Meanwhile, although the board in which the capacitor according to the first exemplary embodiment is mounted on the circuit board is illustrated in FIG. 11, the board is not limited thereto. That is, the capacitor according to another exemplary embodiment may also be mounted on the circuit board in a similar structure, thereby configuring a board having a capacitor.

As set forth above, according to exemplary embodiments presented herein, since the first and second internal electrodes are electrically connected to the first and second external electrodes through the second and first connection electrodes formed along the stacking direction of the dielectric layers, respectively, the overlapping area between the internal electrodes having different polarities may be increased, such that capacitance of the product may be increased without increasing the number of stacked dielectric layers while thinning the thicknesses of the dielectric layers and the internal electrodes, or increasing permittivity.

At the same time, in the capacitor according to the exemplary embodiment, D1×Td and D2×Td are greater than 20 µm², where Td is the thickness of the dielectric layer, and D1 and D2 are the widths of the first and second insulating regions, respectively, such that reliability of the capacitor may be improved by preventing the short-circuit or insulation breakdown from occurring due to cracks occurring at the time of forming the first and second connection electrodes.

Further, since the external electrodes are disposed only on the mounting surface of the body, at the time of mounting the capacitor on the circuit board, a contact area with the solder may be decreased, such that the mounting area may be decreased.

While exemplary embodiments have been shown and described above, it will be apparent to those skilled in the art that modifications and variations could be made without departing from the scope of the present invention as defined by the appended claims.

What is claimed is:

1. A capacitor comprising:
    a body including a plurality of dielectric layers;
    first and second internal electrodes alternately disposed with respective dielectric layers interposed therebetween;
    a first insulating region, disposed in each of the first internal electrodes, including a first connection electrode disposed therein; and
    a second insulating region, disposed in each of the second internal electrodes, including a second connection electrode disposed therein,
    wherein D1×Td and D2×Td are greater than 20 µm² and 60 µm² or less, where Td is a thickness of the dielectric layer, and D1 and D2 are widths of the first and second insulating regions, respectively,
    the first and second connection electrodes are exposed to a side surface of the body, and
    the capacitor further comprises an insulating layer disposed on the side surface of the body to cover the first and second connection electrodes.

2. The capacitor of claim 1, wherein the first and second insulating regions and the first and second connection electrodes are disposed at edges of the first and second internal electrodes.

3. The capacitor of claim 1, wherein the capacitor includes at least two first insulating regions each disposed in each of the first internal electrodes, at least two second insulating regions disposed in each of the second internal electrodes, at least two first connection electrodes disposed in the at least two first insulating regions and interconnecting the second internal electrodes, and at least two second connection electrodes disposed in the at least two second insulating regions and interconnecting the first internal electrodes.

4. The capacitor of claim 1, further comprising first and second external electrodes disposed on an external surface of the body,
    wherein the first external electrode is electrically connected to the first internal electrodes through the second connection electrode, and
    the second external electrode is electrically connected to the second internal electrodes through the first connection electrode.

5. The capacitor of claim 1, wherein a distance between the first and second connection electrodes is equal to or less than 85% of a length of the body.

6. The capacitor of claim 1, wherein at least portions of the first and second internal electrodes are exposed to a side surface of the body.

7. The capacitor of claim 6, further comprising an insulating layer covering the portions of the first and second internal electrodes exposed to the side surface of the body.

8. The capacitor of claim 1, further comprising first and second external electrodes disposed on a lower surface of the body.

9. The capacitor of claim 1, wherein the insulating layer is formed of an insulating resin or a ceramic sheet.

10. The capacitor of claim 1, further comprising a cover layer disposed on an upper portion of the body.

11. A board having a capacitor, the board comprising:
    a circuit board having an upper surface on which first and second electrode pads are formed; and
    the capacitor of claim 1, mounted on the first and second electrode pads of the circuit board.

12. The capacitor of claim 1, wherein D1 is a minimum distance between a first internal electrode and the first connection electrode, and D2 is a minimum distance between a second internal electrode and the second connection electrode.

13. The capacitor of claim 1, wherein the first connection electrode interconnects the second internal electrodes and is insulated from the first internal electrodes by the first insulating region, and the second connection electrode interconnects the first internal electrodes and is insulated from the second internal electrodes by the second insulating region.

14. The capacitor of claim 1, wherein the first insulating region is spaced apart from edges of the first internal electrodes, and the second insulating region is spaced apart from edges of the second internal electrodes.

15. The capacitor of claim 14, wherein the first insulating region has a substantially circular shape surrounding the first connection electrode, and the second insulating region has a substantially circular shape surrounding the second connection electrode.

16. The capacitor of claim 1, wherein the first insulating region contacts an edge of the first internal electrodes, and the second insulating region contacts an edge of the second internal electrodes.

17. The capacitor of claim 16, wherein the first insulating region has a semi-circular shape surrounding the first connection electrode, and the second insulating region has a semi-circular shape surrounding the second connection electrode.

18. The capacitor of claim 1, wherein a distance between the first and second connection electrodes is greater than a sum of radii of the first and second connection electrodes, the widths D1 and D2 of the first and second insulating regions, and a 20 µm interval.

19. The capacitor of claim 1, wherein the plurality of dielectric layers are stacked in a thickness direction of the body, and first and second connection electrodes each penetrate though only a partial thickness of the body in the thickness direction.

* * * * *